(12) United States Patent
Aoki et al.

(10) Patent No.: US 6,833,109 B1
(45) Date of Patent: Dec. 21, 2004

(54) METHOD AND APPARATUS FOR STORING A SEMICONDUCTOR WAFER AFTER ITS CMP POLISHING

(75) Inventors: Hidemitsu Aoki, Tokyo (JP); Shinya Yamasaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/534,296

(22) Filed: Mar. 23, 2000

(30) Foreign Application Priority Data

Mar. 26, 1999 (JP) ............................................ 11-082840

(51) Int. Cl.[7] ........................ B01J 19/00; A47L 15/00; B24B 1/00; C03C 23/00; H01L 21/302
(52) U.S. Cl. ........................ 422/40; 422/28; 422/123; 422/261; 422/294; 422/300; 422/305; 15/77; 451/34; 451/57; 451/65; 451/66; 134/2; 134/19; 134/26; 134/30; 134/42; 134/61; 134/902; 438/690; 438/691; 438/692; 438/693; 510/175; 510/245; 510/252; 510/254; 510/255; 510/258
(58) Field of Search ............................ 422/1, 5, 28, 32, 422/34, 36, 37, 40, 123, 261, 294, 300, 305–306; 15/77; 134/2, 4, 10, 19, 25–26, 30, 34–37, 42, 61, 66, 111, 186, 198–199, 902; 438/690–693; 510/175, 245, 252, 254–255, 258

(56) References Cited

U.S. PATENT DOCUMENTS

| | | | |
|---|---|---|---|
| 5,676,760 A | 10/1997 | Aoki et al. ................... 134/1.3 |
| 5,735,729 A * | 4/1998 | Kobayashi et al. | |
| 5,738,574 A * | 4/1998 | Tolles et al. | |
| 5,779,520 A | 7/1998 | Hayakawa ................... 451/41 |
| 5,804,507 A | 9/1998 | Perlov et al. ................ 438/692 |
| 5,820,689 A | 10/1998 | Tseng et al. .................. 134/3 |
| 5,830,280 A | 11/1998 | Sato et al. ..................... 134/2 |
| 5,849,104 A | 12/1998 | Mohindra et al. .......... 134/25.4 |
| 5,897,375 A * | 4/1999 | Watts et al. | |
| 5,922,136 A * | 7/1999 | Huang | |

FOREIGN PATENT DOCUMENTS

| | | |
|---|---|---|
| EP | 0 674 026 | 9/1995 |
| EP | 0 674 343 | 9/1995 |
| EP | 0 702 399 | 3/1996 |
| EP | 0 727 816 | 8/1996 |

(List continued on next page.)

*Primary Examiner*—Robert J. Warden, Sr.
*Assistant Examiner*—Monzer R. Chorbaji
(74) *Attorney, Agent, or Firm*—Young & Thompson

(57) ABSTRACT

In an apparatus, after completion of a CMP (i.e., chemical mechanical polishing) operation of a semiconductor wafer, the thus polished wafer is temporarily stored in a water tank before it is subjected to a post-CMP cleaning operation. During its storage period in the water tank, the wafer is prevented from being chemically attacked by an oxidizing agent contained in an abrasive used in the CMP operation. The apparatus includes: the water tank for storing the wafer therein; a pure water supply pipe for supplying pure water to the water tank; an anticorrosion agent supply pipe for supplying an anticorrosion agent to the pure water; a drain pipe connected with a lower portion of the water tank to discharge the water from the water tank; a return pipe for returning the discharged water to an upper portion of the water tank through a pump and a filter, the return pipe branching-off from the drain pipe; and, valves mounted on these pipes. The water tank is filled with pure water, to which an anticorrosion agent (i.e., benzotriazole) is added to prepare a solution in which the wafer is immersed after polishing.

24 Claims, 7 Drawing Sheets

FOREIGN PATENT DOCUMENTS

| | | |
|---|---|---|
| JP | A 4-101418 | 4/1992 |
| JP | 7-22369 | 1/1995 |
| JP | 7-66161 | 3/1995 |
| JP | A 7-263398 | 10/1995 |
| JP | A 7-263430 | 10/1995 |
| JP | 8-83783 | 3/1996 |
| JP | 08064594 A | 3/1996 |
| JP | 8-064594 | 3/1996 |
| JP | A 9-241612 | 9/1997 |
| JP | A 9-251969 | 9/1997 |
| JP | 10-214802 | 8/1998 |
| JP | A 10-214802 | 8/1998 |
| JP | A 11-40526 | 2/1999 |
| JP | 2000012494 A | 1/2000 |
| JP | 2000-012494 | 1/2000 |
| JP | A 2000-40679 | 2/2000 |
| WO | WO9940612 | 8/1999 |
| WO | 99/40612 | 8/1999 |

* cited by examiner

METHOD AND APPARATUS FOR STORING A SEMICONDUCTOR WAFER AFTER ITS CMP POLISHING

BACKGROUND OF THE INVENTION

1. Field of the Invention

The present invention relates to a method and apparatus for storing a polished semiconductor wafer after its CMP (i.e., chemical mechanical polishing) process, and more particularly to the method and apparatus for temporarily storing the polished semiconductor wafer in a water tank after its CMP process and before its post-CMP cleaning process, in which the post-CMP cleaning process abrasives (i.e., abrasive grains or powder) for example such as those of alumina, silica, oxidizing agents, or of like substances) used in the CMP process and the wafer's debris remaining on the surface of the polished semiconductor wafer are removed.

2. Description of the Related Art

In a conventional process for forming a metallic wiring in a surface of a semiconductor wafer through a so-called "damascene process": first, an insulation film is formed on a surface of a semiconductor substrate which is constructed of the semiconductor wafer; secondly, a wiring trench and/or a connecting hole connected with a lower wiring layer is formed in the insulation film; and, lastly, the metallic wiring and/or a connecting plug is formed by forming a metallic wiring film of copper or like metal on the semiconductor substrate through an electroplating process of copper or like metal and then removing excess metal or excess copper from the metallic wiring film through a CMP operation to form metallic wiring and/or a connecting plug on the semiconductor substrate.

After completion of the CMP operation, any abrasive and any debris of the thus polished semiconductor wafer are removed from the surface of the polished semiconductor wafer through a post-CMP cleaning operation which follows the CMP operation. In general, at this time, there is a predetermined period of wafer's waiting time between the CMP operation and such post-CMP cleaning operation of the polished semiconductor wafer. In case that the surface of the polished semiconductor wafer becomes dry in the above-mentioned wafer's waiting time, it becomes very hard to remove both the abrasive and the debris of the polished semiconductor wafer from such dried surface. Consequently, in order to keep the surface of the polished semiconductor wafer wet after polishing, the polished-semiconductor wafer having been subjected to the CMP operation is immersed in pure water of a water tank during the above-mentioned wafer's waiting time, as disclosed in Japanese Patent Laid-Open No. Hei 10-214802.

FIG. 9 is a flowchart of process steps performed after completion of the CMP operation of the Cu (i.e., copper) wiring of the semiconductor wafer when a Cu damascene wiring is formed according to a conventional method, illustrating both a conventional CMP unit for CMP polishing the copper, wiring and a conventional post-CMP cleaning unit.

In general, a plurality of (i.e., approximately ten to thirty semiconductor wafers are housed in a wafer carrier to form a batch-processed work called a "lot") which is transferred between adjacent carriers of a plurality of processing units.

In a process step S1 of the flowchart shown in FIG. 9, the polished semiconductor wafer has a Cu film formed on its surface in a Cu film formation unit. Then, the process step S1 is followed by a subsequent process step S2. As a result, the "lot" is transferred from the above Cu film formation unit to a loader chamber 11 of a copper chemical mechanical polishing (i.e., Cu-CMP) unit 10.

More specifically, in the process step S2 for performing the Cu-CMP operation, a set of the polished semiconductor wafers of approximately one to four pieces is retrieved from the wafer carrier having been mounted in the loader chamber 11, is set in a polishing chamber 13 of the Cu-CMP unit 10 and subjected to the CMP process. Since the polished semiconductor wafer has a diameter of approximately 30 cm, it is not practical to prepare a CMP unit which is capable of treating the above-mentioned "lot" of large-diameter semiconductor wafers at a time because of an enormous size of such CMP unit, wherein the "lot" is composed of a plurality of such large-diameter semiconductor wafers.

Consequently, in the process step S2 shown in the flowchart of FIG. 9, in general, approximately one to four semiconductor wafers are treated at a time. After completion of the CMP operation, these polished semiconductor wafers are housed in another wafer carrier provided in an unloader chamber 12 of the CMP unit 10, and enter a waiting mode in this unloader chamber 12 and kept therein until another wafer carrier is filled with these polished semiconductor wafers having been subjected to the CMP operations. On the other hand, this unloader chamber 12 is provided with a wafer storing water tank (not shown), in which the thus polished semiconductor wafers are stored in water, and thereby preventing their surfaces from becoming dry after completion of their CMP polishing operations.

After completion of the process step S2 for performing the Cu-CMP operations of copper or metallic wirings of the polished semiconductor wafers of the above-mentioned "lot", another wafer carrier is transferred from the unloader chamber 12 to a loader chamber 16 of a post-CMP cleaning unit 14 to enter a process step S3 subsequent to the process step S2. In the process step S3, the "lot" is subjected to the post-CMP cleaning process. On the other hand, the loader chamber 16 of the post-CMP cleaning unit 14 is also provided with another wafer storing water tank for receiving the polished semiconductor wafers having been subjected to the CMP operations, wherein these polished semiconductor wafers are stored in water of another water tank to prevent their surfaces from drying.

In the post-CMP cleaning unit 14 shown in FIG. 9, a cleaning or post-CMP cleaning chamber 15 is disposed adjacent to the loader chamber 16. Consequently, the polished semiconductor wafers are transferred from the loader chamber 16 to this post-CMP cleaning chamber 15 singly and successively, then subjected to scrubbing operations with the use of both a brush and a cleaning liquid issued to the individual polished semiconductor wafers, and lastly rinsed out with the use of alcohol and water. After that, the polished semiconductor wafers thus rinsed out are dried in a drying chamber 17. This drying chamber 17 is disposed adjacent to the post-CMP cleaning chamber 15, as shown in FIG. 9. The polished semiconductor wafers thus dried up are then transferred to further another wafer carrier 22 which is provided in an unloader chamber 19 disposed adjacent to the drying chamber 17.

After completion of the post-CMP cleaning operation in the process step S3, the process step S3 is followed by its subsequent process step S4. In this subsequent process step S4, for example, a cover film is formed on the surface of each of the polished semiconductor wafers of the further another wafer carrier.

Shown in FIG. 10 is a conventional apparatus for storing the polished semiconductor water in a wafer storing water tank 18 thereof. In this conventional apparatus, the polished semiconductor wafer is immersed in pure water received in the wafer storing water tank 18. More specifically, as shown in FIGS. 9 and 10, the wafer storing water tank 18 shown in FIG. 10 is installed in the unloader chamber 12 (shown in FIG. 9) of the CMP unit 10, and also installed in the loader chamber 16 (shown in FIG. 9) of the post-CMP cleaning unit 14. In operation, the wafer storing water tank 18 is filled with pure water 43, so that the polished semiconductor wafers 20 housed in the wafer carrier 22 are immersed in the pure water 43 of the wafer storing water tank 18, to which tank 18 the pure water is constantly supplied from the outside.

There is another conventional method, in which the polished semiconductor wafers are not immersed in the pure water 43 but sprayed with pure water. Shown in FIG. 11 is a part of a conventional apparatus carrying out the latter conventional method for spraying the polished semiconductor wafers 20 with a spray 24 of pure water having a temperature ranging from more than 25° C. to 28° C. In the latter conventional method, the polished semiconductor wafers 20 are housed in the wafer carrier 22 and subjected to the spray 24 of pure water.

In the conventional methods and apparatuses described above, the pure water, which is used as the pure water 43 in the wafer storing water tank 18 and also used as the spray 24 in FIG. 11, has a temperature substantially equal to room temperatures ranging from approximately 25 to approximately 28° C.

Now, the problems inherent in the conventional methods and apparatuses and therefore solved by the present invention will be described.

For example, in a condition in which the wafer carrier is capable of housing therein twenty-four pieces of the polished semiconductor wafers at a time and the CMP unit 10 is capable of treating four polished semiconductor wafers in approximately 10 to 15 minutes at a time, it takes approximately 60 to 100 minutes to treat the above-mentioned one "lot" of the polished semiconductor wafers, which requires the polished semiconductor wafers to be temporarily stored in the wafer storing water tank of the unloader chamber 19 in the CMP unit 14 until treatment of this "lot" of the polished semiconductor wafers is completed. In like manner, in a condition in which the cleaning chamber 15 of the post-CMP cleaning unit 14 is capable of treating each of the polished semiconductor wafers in approximately two or three minutes at a time, it takes approximately 40 to 60 minutes to treat the "lot" of the polished semiconductor wafers, which requires the polished semiconductor wafers to be temporarily stored in the water tank of the loader chamber 16 in the post-CMP cleaning unit 14 until treatment of this "lot" of the polished semiconductor wafers is completed. Further, when some trouble occurs in the CMP unit 10 and/or the post-CMP cleaning unit 14, it is necessary to store the polished semiconductor wafers in the water of the water tank or to have these polished semiconductor wafers sprayed with the water for a time period of from approximately several hours to approximately twenty-four hours.

For example, in a polishing operation for forming the Cu (i.e., copper) damascene wiring, when the wafer's waiting period of time of each of the polished semiconductor wafers between the polishing operation and the post-polishing cleaning operation is large, the Cu or metallic wiring is subjected to corrosion caused by an oxidizing agent. This oxidizing agent is contained in the abrasive used in the polishing operation and remains in the surface of each of the polished semiconductor wafers. As a result of such corrosion of the Cu or metallic wiring of each of the polished semiconductor wafers, the electric resistance of the Cu wiring increases. This is one of problems inherent in the conventional methods and apparatuses.

On the other hand, in a graph of FIG. 12 shows the change in configuration of the Cu or metallic wiring of the polished semiconductor wafer with elapsed period of time due to the corrosion occurring in the metallic wiring. Formed on the surface of the polished semiconductor wafer forming a polished semiconductor substrate 29 shown in FIG. 12 is an insulation film 27 made of $SiO_2$ and the like. A wiring trench and/or a connecting hole are/is formed in a portion of the insulation film 27. A suitable barrier film 25 made of TaN and the like is formed inside the wiring trench and/or the connecting hole. Formed inside the barrier film 25 are a Cu or metallic wiring 23 and/or a connecting hole. Adhered to the surface of the polished semiconductor wafer are the abrasive grain or power and the debris 26 of the polished semiconductor wafer in addition to the oxidizing agent 28 derived from the abrasive grain or powder. The oxidizing agent adhering to the surface of the Cu or metallic wiring 23 chemically attacks the copper or metal forming the Cu or metallic wiring to cause corrosion thereof. Due to such corrosion of the Cu or metallic wiring, the Cu or metallic wiring is reduced in thickness to have its top surface be lower in height than the insulation film 27 surrounding the Cu or metallic wiring on all sides, which forms a shoulder portion in the surface of the polished semiconductor wafer. Due to the presence of such shoulder portion formed in the surface of the polished semiconductor wafer, it is difficult to remove the debris 26 adhering to a corner portion (i.e., shoulder portion) of the wiring trench or of the connecting hole of the polished semiconductor wafer, which impairs the surface of the polished semiconductor wafer in cleaning efficiency. Further, since the thickness of the Cu or metallic wiring of the polished semiconductor wafer is reduced as described above, the electric resistance of the Cu or metallic wiring of the polished semiconductor wafer increases.

The conventional methods, in which each of the polished semiconductor wafer is immersed in pure water of the water tank or sprayed with pure water, pose various types of problems caused by corrosion of the Cu or metallic wiring of the polished semiconductor wafer in addition to the above-mentioned problem.

SUMMARY OF THE INVENTION

In view of the above, It is an object of the present invention to provide a method and apparatus for storing a polished semiconductor wafer after its polishing process in which the anticorrosion agent is capable of adhering to the surface of the polished semiconductor wafer to protect its surface against corrosion.

According to a first aspect of the present invention, there is provided a method for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the method including the step of:

keeping the polished semiconductor wafer immersed in pure water, to which water an anticorrosion agent is added, wherein the anticorrosion agent prevents an oxidizing agent contained in an abrasive from chemically attacking the metallic wiring of the polished semiconductor wafer, wherein the abrasive is used in the CMP process.

In the foregoing, a preferable mode is one wherein the pure water is recycled together with the anticorrosion agent through a water tank.

Further, a preferable mode is one wherein the metallic wiring of the polished semiconductor wafer is constructed of a damascene wiring or of a connecting plug.

Still further, a preferable mode is one wherein the metallic wiring of the polished semiconductor wafer is formed of metal selected from the group consisting of: copper; aluminum; alloys of copper; alloys of aluminum; and, copper-aluminum alloys.

Also, a preferable mode is one wherein the anticorrosion agent is made of a compound selected from the group consisting of: benzotriazole; o-tolyltriazole; m-tolyltriazole; p-tolyltriazole; carboxybenzotriazole; l-hydroxybenzotriazole; nitrobenzotriazole; dihydroxypropylbenzotriazole; and, a mixture of at least any two of the above-mentioned compounds.

Further, a preferable mode is one wherein the anticorrosion agent to be added to the pure water is made of benzotriazole.

Still further, a preferable mode is one wherein addition of the anticorrosion agent made of benzotriazole to the pure water is made at a rate of from 0.01% to 5%.

Also, according to a second aspect of the present invention, there is provided a method for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the method including the step of:

keeping the polished semiconductor wafer immersed in pure water having a predetermined temperature, wherein the predetermined temperature is capable of decreasing a rate of chemical reaction occurring in corrosion of the metallic wiring of the polished semiconductor wafer, wherein the corrosion is caused by an oxidizing agent contained in an abrasive, and the abrasive is used in the CMP process.

Also, according to a third aspect of the present invention, there is provided a method for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the method including the step of:

spraying the polished semiconductor wafer with pure water having a predetermined temperature, wherein the predetermined temperature is capable of decreasing a rate of chemical reaction occurring in corrosion of the metallic wiring of the polished semiconductor wafer, wherein the corrosion is caused by an oxidizing agent contained in an abrasive, and the abrasive is used in the CMP process.

In the foregoing second and third aspects, a preferable mode is one wherein the metallic wiring is constructed of a damascene wiring or of a connecting plug.

Further, a preferable mode is one wherein the metallic wiring of the polished semiconductor wafer is formed of metal selected from a group consisting of: copper; aluminum; alloys of copper; alloys of aluminum; or, copper-aluminum alloys.

Still further, a preferable mode is one wherein the predetermined temperature of the pure water is within a range of from 0° C. to 25° C.

Most preferable mode is one wherein the predetermined temperature of the pure water is within a range of from 0° C. to 10° C.

Also, according to a fourth aspect of the present invention, there is provided a method for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the method including the step of:

keeping the polished semiconductor wafer immersed in reducing water.

In the foregoing fourth aspect, a preferable mode is one wherein the reducing water is prepared by bubbling hydrogen gas through pure water, or retrieved from a cathode side of pure water during the electrolysis of the pure water.

Also, according to a fifth aspect of the present invention, there is provided an apparatus for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the apparatus including:

a water tank for keeping the polished semiconductor wafer immersed in reducing water.

In the foregoing fifth aspect, a preferable mode is one wherein the water tank is hermetically sealed in a manner such that the water tank has no communication with the atmosphere.

Also, according to a sixth aspect of the present invention, there is provided an apparatus for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the apparatus including:

a water tank for storing said polished semiconductor wafer therein;

a pure water supply means for supplying pure water to the water tank, wherein an anticorrosion agent is added to the pure water to prevents an oxidizing agent contained in an abrasive from chemically attacking the metallic wiring of the polished semiconductor wafer, wherein the abrasive is used in the CMP process;

a recycling means for recycling the pure water together with the anticorrosion agent through both a filter and the water tank; and a discharging means for discharging out of the water tank the pure water together with the anticorrosion agent both received in the water tank.

In the foregoing aspect, a preferable mode is one wherein the recycling means is provided with a pump and the filter both disposed outside the water tank.

Also, according to a seventh aspect of the present invention, there is provided an apparatus for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the apparatus including:

a water tank for storing the polished semiconductor wafer therein;

a pure water supply means for supplying pure water to the water tank, wherein the pure water having a predetermined temperature which is capable of decreasing a rate of chemical reaction occurring in corrosion of the metallic wiring of the polished semiconductor wafer, wherein the corrosion is caused by an oxidizing agent contained in an abrasive used in the CMP process; and a discharging means for discharging out of the water tank the pure water together with the anticorrosion agent both received in the water tank.

Furthermore, according to a eighth aspect of the present invention, there is provided an apparatus for storing a polished semiconductor wafer after completion of its CMP process for a period of time intervened between: the CMP process for forming a metallic wiring in the polished semiconductor wafer; and, a cleaning process of the thus polished semiconductor wafer, wherein the cleaning process follows the CMP process, the apparatus including:

a spray means for spraying the polished semiconductor wafer with pure water having a predetermined temperature which is capable of decreasing a rate of chemical reaction occurring in corrosion of the metallic wiring of the polished semiconductor wafer, wherein the corrosion is caused by an oxidizing agent contained in an abrasive used in the CMP process.

In the foregoing eighth aspect, a preferable mode is one wherein the metallic wiring of the polished semiconductor wafer is constructed of a damascene wiring or of a connecting plug.

Further, a preferable mode is one where the predetermined temperature of the pure water is within a range of from 0° C. to 25° C.

Still further, a most preferable mode is one wherein the predetermined temperature of the pure water is within a range of from 0° C. to 10° C.

With the above construction, since the anticorrosion agent is capable of adhering to the surface of the polished semiconductor wafer to protect its surface against corrosion, it is possible for the method of the present invention to prevent the exposed surface of the metallic wiring of the polished semiconductor wafer from being chemically attacked in a period of time intervened between the CMP process and the post-CMP cleaning process of the thus polished semiconductor wafer, wherein the post-CMP cleaning process follows the CMP process. Further, by recycling the pure water which is received in the wafer storing water tank and to which pure water the anticorrosion agent has been added, it is also possible for the apparatus and method of the present invention to reduce the amount of the anticorrosion agent used in operation.

Further, in the method of the present invention using the pure water having the above-mentioned predetermined low temperature or supplying the reducing water, since the chemical reaction occurring in corrosion of the Cu or metallic wiring of the polished semiconductor wafer caused by the oxidizing agent derived from the abrasive grain or powder is reduced in reaction rate, it is possible to protect the exposed surface of the metallic wiring of the polished semiconductor wafer 20 against corrosion.

Consequently, in the method and apparatus of the present invention, it is possible to ensure the metallic wiring of the polished semiconductor wafer in its electrical conductivity, and therefore in its reliability in operation. Further, in the method and apparatus of the present invention, since the metallic wiring of the polished semiconductor wafer is free from any corrosion, there is no danger that the metallic wiring is reduced in thickness to produce a shoulder portion in the surface of the polished semiconductor wafer. Consequently, in the method and apparatus of the present invention, there is no danger that the post-CMP cleaning operation of the polished semiconductor wafer becomes poor in cleaning efficiency.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
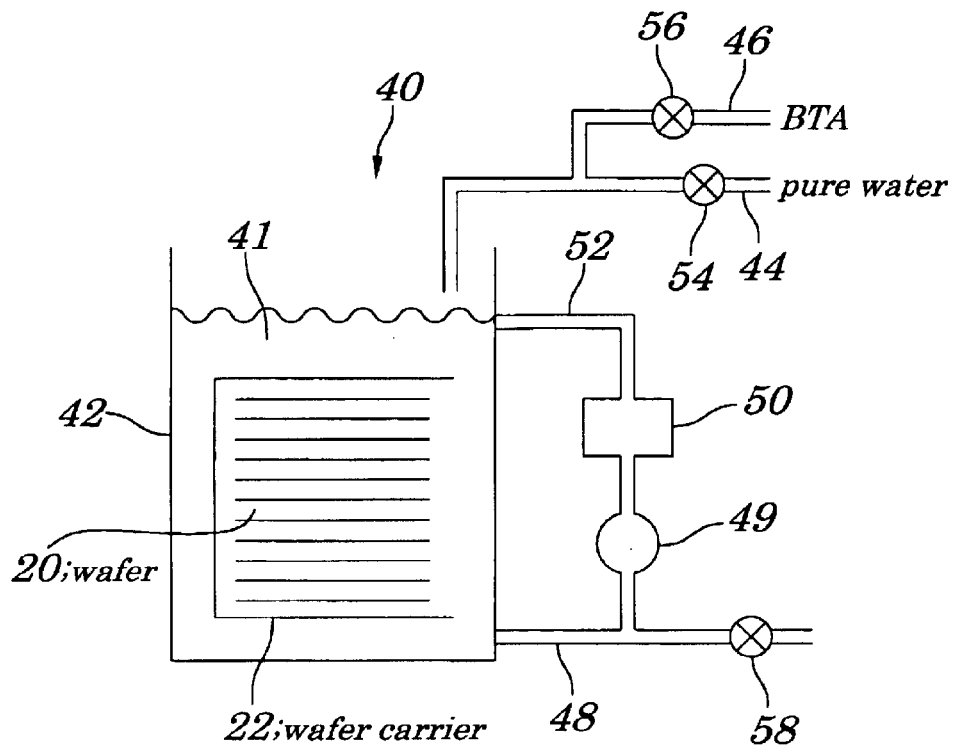
FIG. 1 is a schematic diagram showing an apparatus for storing a polished semiconductor wafer in a water tank thereof after polishing according to a first embodiment of the present invention.

Shown in FIG. 1 is a first embodiment of an apparatus 40 of the present invention for storing a polished semiconductor wafer 20 in a wafer storing water tank 42 of the apparatus 40 after polishing.

As is clear from FIG. 1, the apparatus 40 of the present embodiment is constructed of: the wafer storing water tank 42; a pure water supply pipe 44 for supplying pure water to the wafer storing water tank 42; a anticorrosion agent (i.e., BTA) supply pipe 46 for supplying an anticorrosion agent (i.e., BTA) to the pure water supply pipe 44, and therefore to the wafer storing water tank 42; a drain pipe 48 connected with a lower portion of the wafer storing water tank 42 to discharge a liquid contained in the wafer storing water tank 42 out of the wafer storing tank 42; a return pipe 52 branching off from the drain pipe 48 and connected with an upper portion of the wafer storing water tank 42 through a pump 49 and a filter 50 to return the thus discharged liquid to the upper portion of the wafer storing water tank 42; and, a plurality of valves 54, 56 and 58 which are mounted on the pure water supply pipe 44, anticorrosion agent supply pipe 46 and drain pipe 48, respectively.

Figure 9:
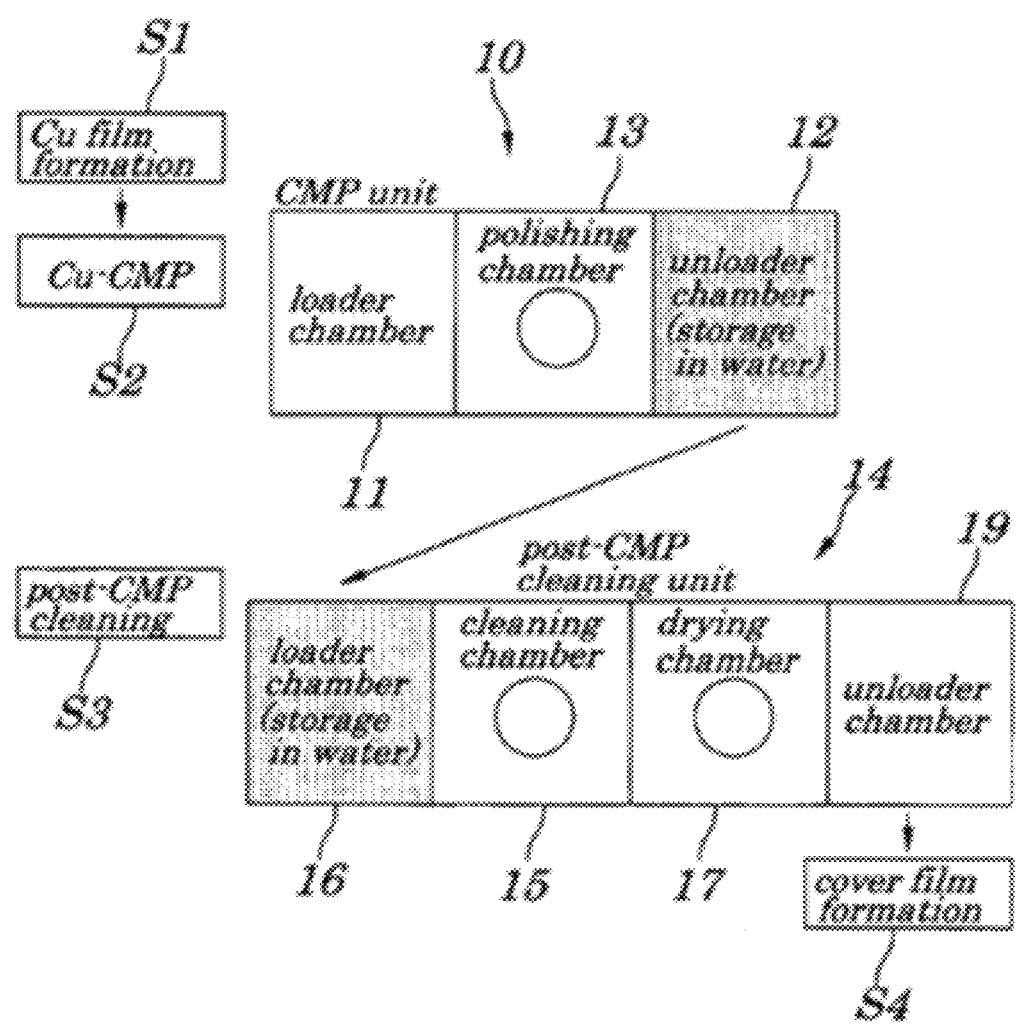
FIG. 9 is a schematic diagram of the conventional method, illustrating a flowchart of process steps performed after completion of the CMP operation of the copper or metallic wiring of the polished semiconductor.

The apparatus 40 having the above construction may be provided in each of: an unloader chamber 12 (shown in FIG. 9) of a CMP unit 10 (shown in FIG. 9); and, a loader chamber 16 (shown in FIG. 9) of a post-CMP cleaning unit 14 (shown in FIG. 9).

The following description will be made as to the polished semiconductor wafer 20 having been already subjected to a Cu-CMP operation to form a Cu or metallic wiring in the surface of the polished semiconductor wafer through a damascene process, wherein the polished semiconductor wafer is stored in the apparatus 40.

In operation of the apparatus 40, at first, the wafer storing water tank 42 receives an anticorrosion agent, benszotriazole (i.e., BTA) through the anticorrosion agent supply pipe 46 and also receives pure water through the pure water supply pipe 44. When the total amount of the pure water and the anticorrosion agent both having been received by the wafer storing water tank reaches a predetermined value, both valves 54, 56 are closed. As a result, a plurality of the polished semiconductor wafers 20, which have been already subjected to the Cu-CMP process to form a batch-processed work called a "lot", are housed in a wafer carrier 22, and then immersed into pure water 41 containing the anticorrosion agent, BTA, supplied from its anticorrosion agent supply pipe 46 to the pure water supply pipe 44.

During a wafer storing period of time in the wafer storing water tank 42, the pump 49 is continuously driven so that the pure water and the anticorrosion agent both used in operation are discharged-out of the wafer storing water tank 42 through its lower portion communicating with the drain pipe 48. The thus discharged pure water and the anticorrosion agent pass through the filter 50. At this time, in this filter 50, both an abrasive grain used in the CMP operation and the debris of such polished semiconductor wafers 20, both of which abrasive grain and debris have been separated from the surfaces of the polished semiconductor wafers 20 and are in suspension in the discharged water, are trapped in the filter 50 and removed from the discharged water. After that, the discharged pure water and the anticorrosion agent passed through the filter 50 are then returned to the wafer storing water tank 42 through its upper portion communicating with the return pipe 52. As described above, the pure water or liquid and the anticorrosion agent received in the wafer storing water tank 42 are recycled in operation. Consequently, it is possible for the apparatus 40 to use a minimum possible amount of such expensive pure water or liquid together with a minimum possible amount of such expensive anticorrosion agent, which reduces a possible risk for the environment caused by the disposal of waste water or liquid together with the disposal of such harmful anticorrosion agent, and also reduces the cost required for disposal of such waste water or the anticorrosion agent. In operation, the wafer storing water tank 42 of the apparatus 40 discards a part of the pure water 41 containing the anticorrosion agent, BTA through the drain pipe 48 at predetermined time intervals, and receives, at predetermined time intervals, fresh pure water and fresh anticorrosion agent through the pure water supply pipe 44 and anticorrosion agent supply pipe 46, respectively.

Figure 2:
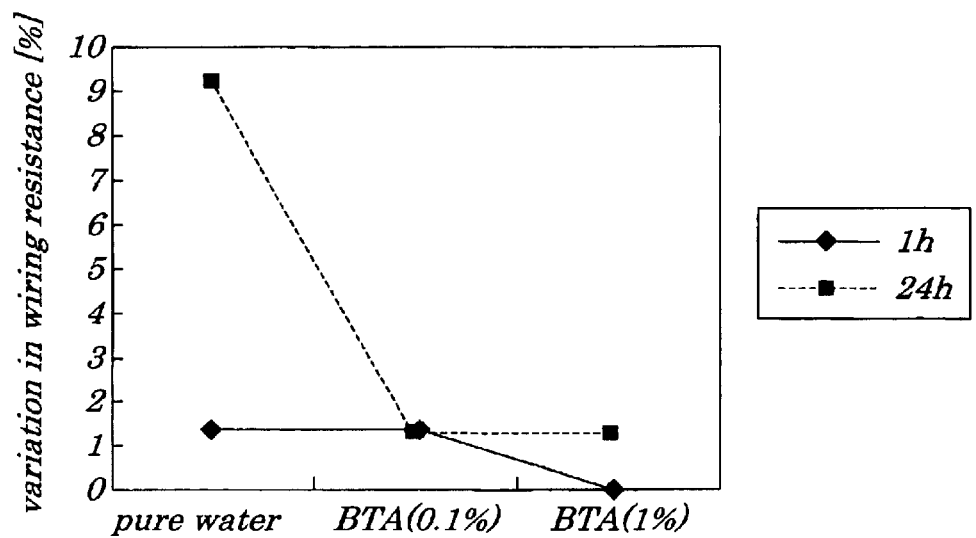
FIG. 2 is a graph showing the measurement results in variation of electric resistance of Cu or metallic wirings of polished semiconductor wafers in the first embodiment.

Shown in FIG. 2 is a graph of the measurement results in variation of an electric resistance of the Cu wirings of the polished semiconductor wafers 20. These measurement results are obtained by using the apparatus 40. In measurement, one of the polished semiconductor wafers was immersed in the solution 41 (that is, the pure water 41 containing the anticorrosion agent, BTA) of the wafer storing water tank for one hour after polishing, and the other of the polished semiconductor wafers was immersed in the solution 41 for 24 hours after polishing, wherein: a horizontal axis of the graph represents variation in concentration of the anticorrosion agent of BTA contained in the solution 41; and, the solution 41 is varied in concentration of the anticorrosion agent contained therein from a minimum concentration of 0% of BTA (used for only the purpose of comparison) to a maximum concentration of 1% of BTA through a medium concentration of 0.1% of BTA, as shown in FIG. 2.

The graph shown in FIG. 2 has demonstrated effects of addition of the anticorrosion agent (i.e., BTA) of more than 0.01% to the pure water when the polished semiconductor wafers 20 are immersed in the solution 41 of the wafer storing water tank 42 for one hour or for 24 hours, wherein the solution 41 consists both the pure water and the anticorrosion agent of more than 0.01%. As described above, the anticorrosion agent BTA is expensive, and harmful substance posing a risk for the environment. Consequently, preferably, a maximum amount of such harmful anticorrosion agent or BTA added to the pure water of the wafer storing water tank 42 is limited up to 5%.

As an oxidizing agent contained in the abrasive used in the Cu-CMP operations of the polished semiconductor wafers 20, there are: hydrogen dioxide; calcium carbonate; iron oxide; iron sulfate; and, or like oxidizing agents.

On the other hand, as the anticorrosion agent for preventing the above-mentioned oxidizing agent from chemically attacking the Cu wirings of the polished semiconductor wafers 20, there are:

benzotriazole; o-tolyltriazole; m-tolyltriazole;
p-tolyltriazole; carboxybenzotriazole;
1-hydroxybenzotriazole; nitrobenzotriazole;
dihydroxypropylbenzotriazole; or, a mixture of at least any two of the above-mentioned compounds. Of these mixtures and compounds, a most favorable one is BTA.

Second Embodiment

Figure 3:
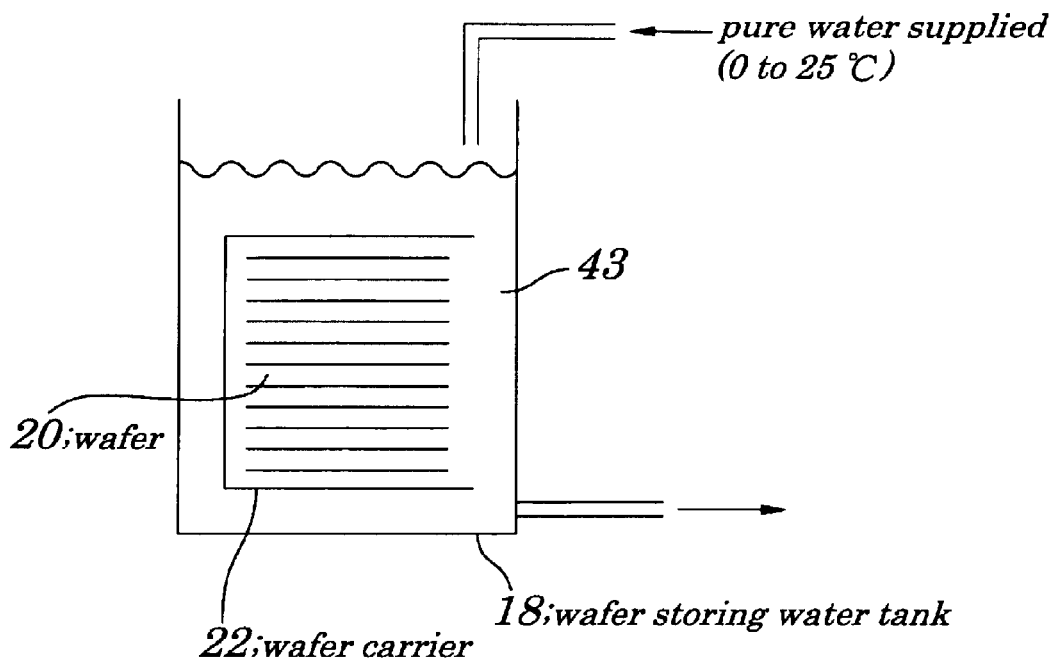
FIG. 3 is a schematic diagram showing the apparatus for storing the polished semiconductor wafers in a water tank thereof after polishing according to a second embodiment of the present invention.
Figure 10:
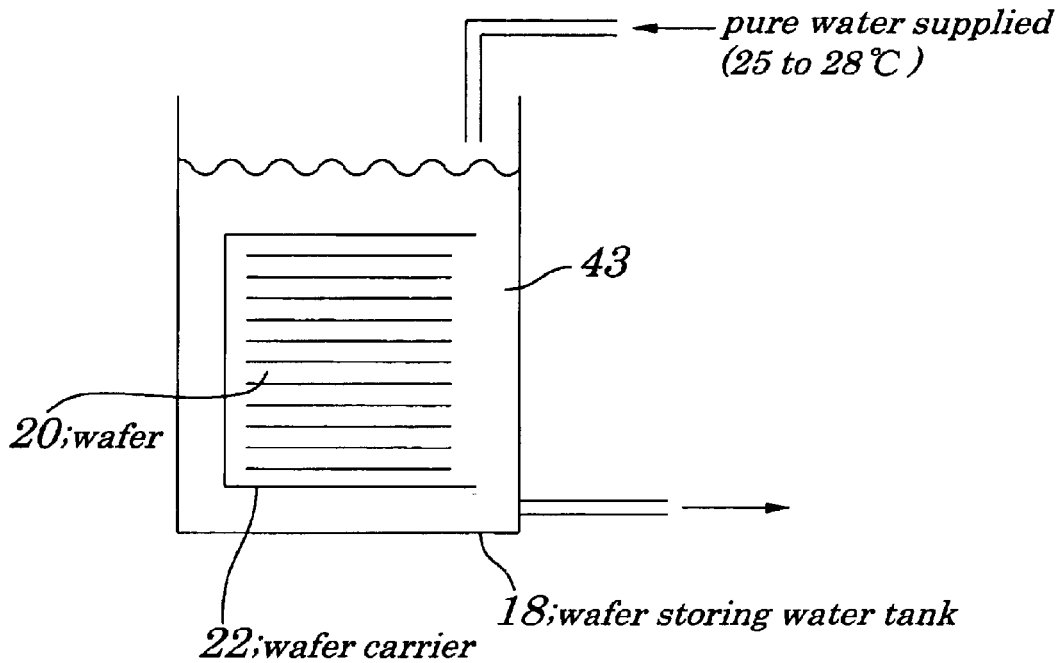
FIG. 10 is a schematic diagram of the conventional apparatus for storing the polished semiconductor water in a water tank thereof.
Figure 11:
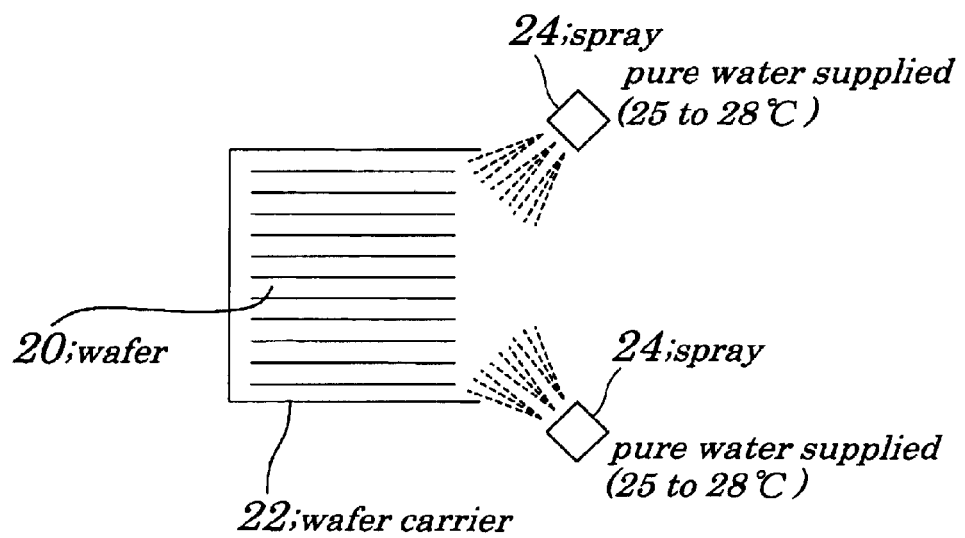
FIG. 11 is a schematic diagram of a part of the conventional apparatus, which carries out the conventional method for spraying the polished semiconductor wafer with the pure water
Figure 12:
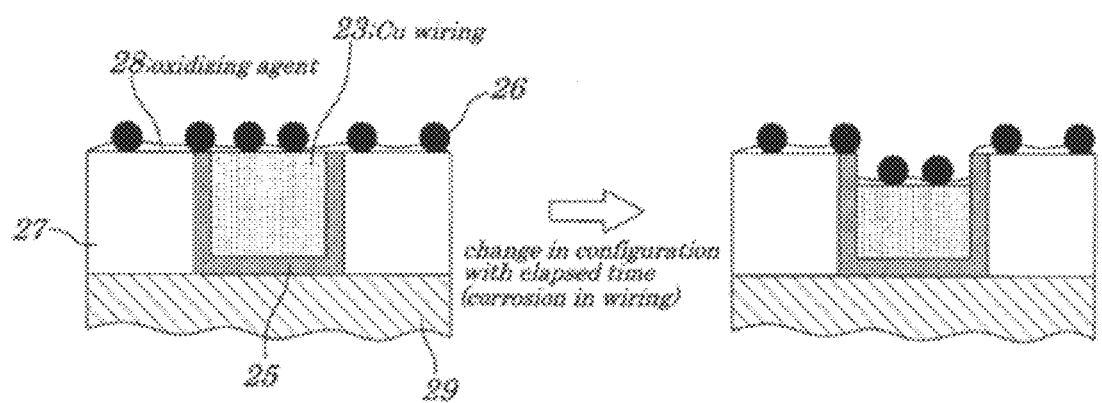
FIG. 12 is a graph showing the change in configuration of the Cu or metallic wiring of the polished semiconductor wafer with an elapsed period of time due to corrosion of the copper or metallic wiring.

FIG. 3 shows a second embodiment of the apparatus of the present invention for storing the polished semiconductor wafer in a conventional type of wafer storing water tank 18 (shown in FIG. 10) after polishing. In this second embodiment, provided with the conventional wafer storing water tank 18, pure water 43 supplied to the wafer storing water tank 18 has a sufficiently low temperature which enables the pure water 43 to decrease in 4 reaction rate any chemical reaction causing corrosion of the Cu or metallic wiring of each of the polished semiconductor wafers 20. The pure water 43 having such low temperature is supplied to an upper portion of the wafer storing water tank 18, and discharged from a lower portion of the wafer storing water tank 18. In other words, fresh pure water 43 is constantly supplied to the wafer storing water tank 18.

Figure 4:
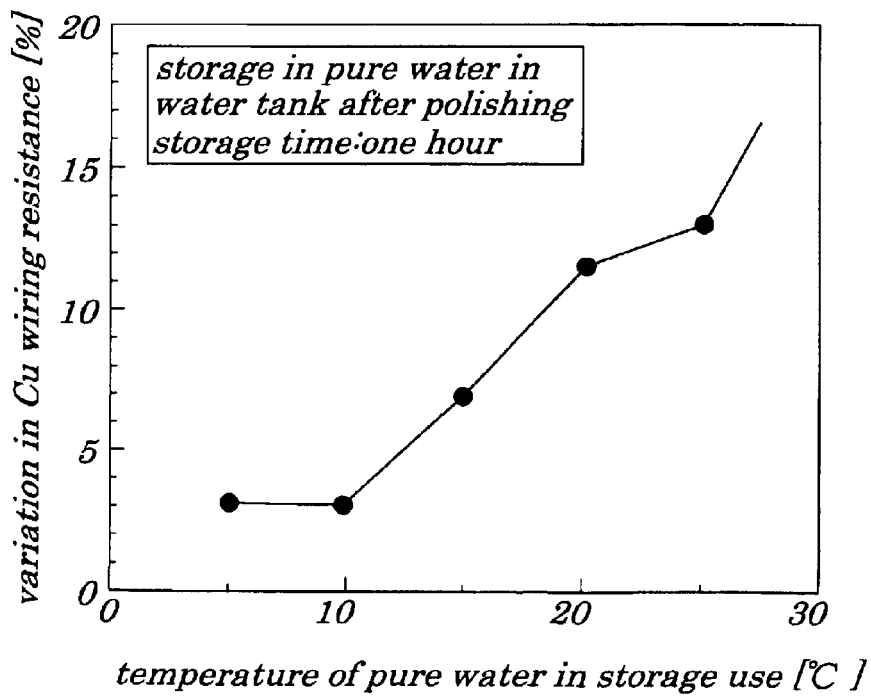
FIG. 4 is a graph of effects of temperature of pure water in storage use versus variation in electric resistance of the copper wiring of the polished semiconductor wafer after polishing in the second embodiment.

As described above, fresh pure water 43 was constantly supplied to the wafer storing water tank 18, and the polished semiconductor wafers 20 having been already subjected to the Cu-CMP operation were immersed in such fresh low-temperature pure water 43 of the wafer storing water tank 18. Under such circumstances, measurement of the dependency in electric resistance of the Cu or metallic wiring of each of the polished semiconductor wafers 20 on the storage time was made by varying the temperature of the fresh pure water 43. A graph shown in FIG. 4 demonstrates the effects of temperatures of the pure water 43 in storage use on the variation in electric resistance of the Cu or metallic wiring of each of the polished semiconductor wafers 20 after polishing. As is clear from the graph of FIG. 4, through the above measurement, it has been confirmed that: when the temperature of the pure water 43 is within a range of from 0° C. to 25° C., the variation in electric resistance of the Cu wiring is small. However, when the temperature of the pure water 43 is more than 25° C., the variation in electric resistance of the Cu wiring becomes large. Further, through the above measurement, it has been confirmed that: when the temperature of the pure water 43 in the wafer storing water tank 18 (shown in FIG. 3) is within a range of from 0° C. to 10° C., the variation in electric resistance of the Cu wiring keeps a very small value of approximately 3%. Consequently, the above temperature range of 0° C. to 10° C. of the pure water 43 is most favorable for the storage of the polished semiconductor wafers 20 provided with the Cu or metallic wirings in the wafer storing water tank 18.

Figure 5:
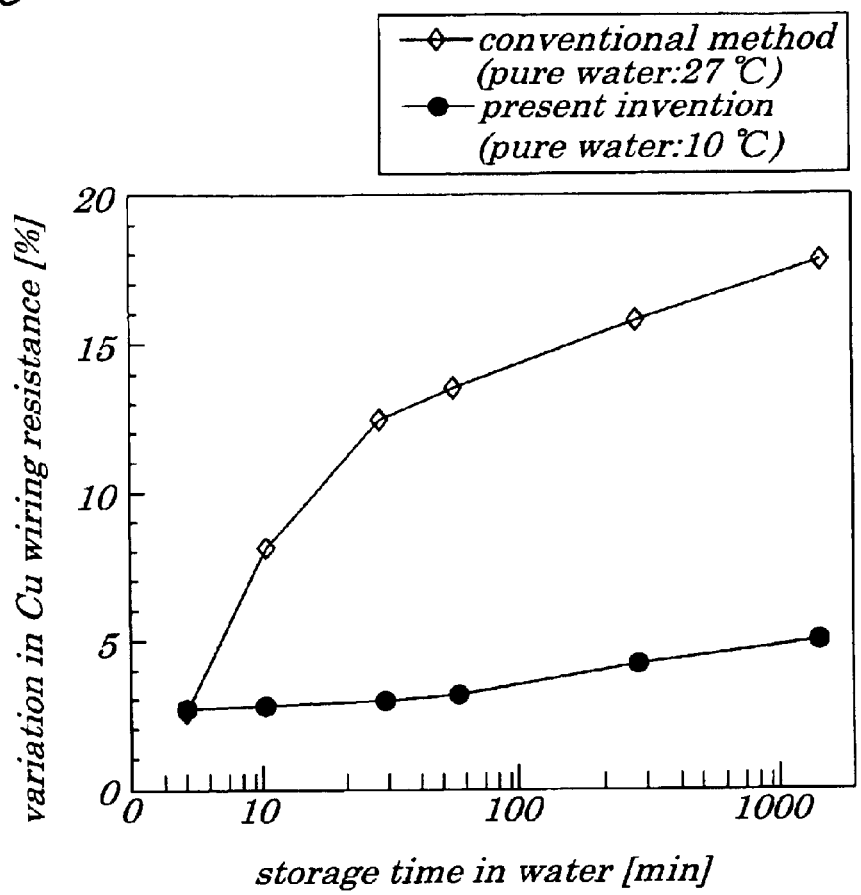
FIG. 5 is a graph showing effects of a method of the second embodiment in comparison with a conventional method on the electric resistance of the copper wiring of the polished semiconductor wafer having been subjected to a Cu-CMP operation.

A graph shown in FIG. 5 demonstrates the effects of the method of the present embodiment in comparison with the conventional method on the variation in electric resistance of the Cu or metallic wiring of the polished semiconductor wafer 20 having been subjected to the Cu-CMP operation. In this graph of FIG. 5, its horizontal axis represents the storage period of time of the polished semiconductor wafer, for which period of time in pure water of the polished semiconductor wafer 20 is immersed in the pure water 43 of the wafer storing water tank 18 (shown in FIG. 3). The pure water has a temperature of 10° C. On the other hand, in the conventional method for the purpose of comparison with the method of the present embodiment, the pure water 43 is kept at a temperature of 27° C. By using this graph of FIG. 5, it is possible to determine the dependency of the electric resistance in the Cu or metallic wiring of the polished semiconductor wafer 20 on the storage time when the polished semiconductor wafer 20 is immersed in the pure water 43. As is clear from FIG. 5, in the conventional method in which the pure water 43 is kept at a temperature of 27° C., the variation in electric resistance of the Cu or metallic wiring of the polished semiconductor wafer 20 increases when the storage time in the pure water 43 exceeds ten minutes. In contrast with this, in the method of the present embodiment in which the pure water 43 has a temperature of 10° C., the variation in electric resistance of the Cu or metallic wiring stays at a very low value of approximately 4% even when the storage time in the pure water 43 reaches substantially 1000 minutes, which indicates that corrosion of the Cu or metallic wiring of the polished semiconductor wafer 20 is effectively suppressed in the method of the present embodiment.

Third Embodiment

Figure 6:
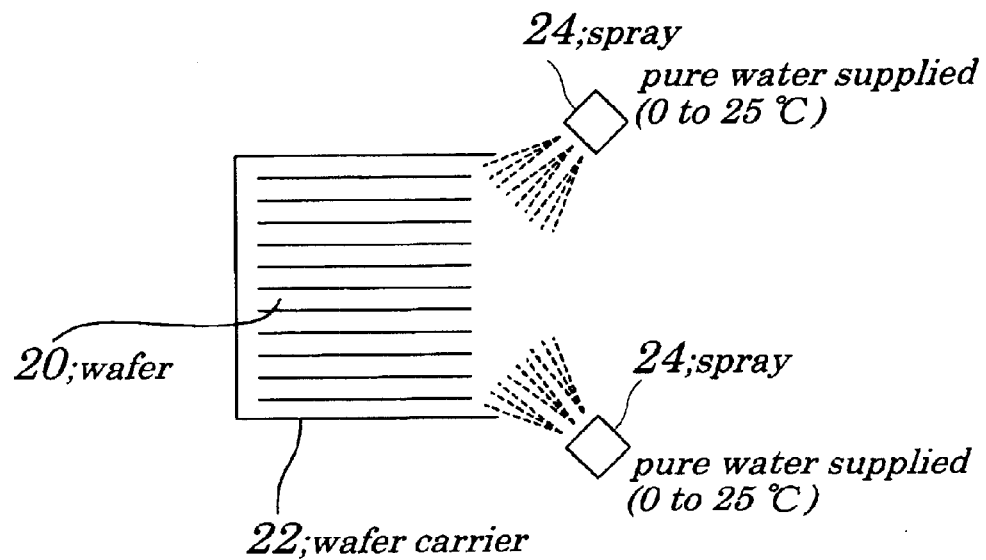
FIG. 6 is a schematic diagram showing the apparatus for storing the polished semiconductor wafer in the water tank thereof after polishing according to a third embodiment of the present invention.

FIG. 6 shows a third embodiment of the apparatus of the present invention for spraying the polished semiconductor wafers 20 with the pure water forming a spray 24. Carried out in this apparatus of the present invention is the method of the present invention for spraying the polished semiconductor wafers 20 with the pure water having a temperature ranging from 0° C. to 25° C., preferably ranging from 0° C. to 10° C. as is already described in connection with the second embodiment of the present invention shown in FIG. 3. In this third embodiment of the present invention shown in FIG. 6: the pure water to be issued to the polished semiconductor wafers 20 forms a pair of the sprays 24 each provided in each of opposite sides of the wafer carrier 22; and, each of these sprays 24 has a sufficiently low temperature which enables the pure water to decrease in reaction rate any chemical reaction occurring in corrosion of the Cu or metallic wiring of each of the polished semiconductor wafers 20.

Fourth Embodiment

Figure 7:
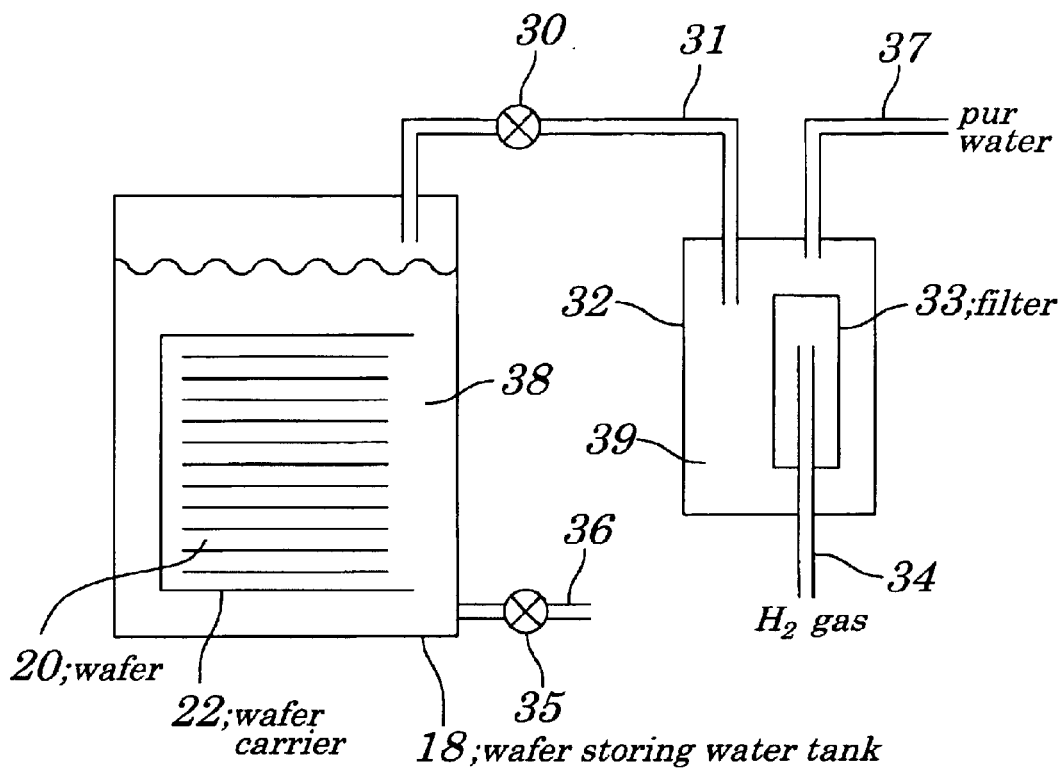
FIG. 7 is a schematic diagram showing the apparatus for storing the polished semiconductor wafer in the water tank thereof after polishing according to a fourth embodiment of the present invention.

FIG. 7 shows a fourth embodiment of the apparatus of the present invention for storing the polished semiconductor wafer in the wafer storing water tank 18 thereof after polishing. As shown in FIG. 7, the apparatus of the present embodiment uses the wafer storing water tank 18 for the purpose of preventing the surface of each of the polished semiconductor wafers 20 from drying after polishing as is in the wafer storing water tank 42 of the apparatus of the first embodiment shown in FIG. 1.

Consequently, the apparatus of the present embodiment may be installed in each of the unloader chamber 12 of the CMP unit 10 (shown in FIG. 9) and the loader chamber 16 (shown in FIG. 9) of the post-CMP cleaning unit 14. In contrast with the apparatus of the first embodiment shown in FIG. 1 in which the solution 41 composed of the pure water and the anticorrosion agent BTA is used, the apparatus of the present embodiment shown in FIG. 7 uses a reducing water 38.

As shown in FIG. 7, all the polished semiconductor wafers 20, wafer carrier 22, and the wafer storing water tank 18 are the same as those of the first embodiment of the apparatus of the present invention shown in FIG. 1, and therefore not described here again to avoid redundancy in description. The wafer storing water tank 18 is filled with the reducing water 38. In this reducing water 38, the wafer carrier 22 carrying the polished semiconductor wafers 20 is immersed.

The reducing water 38 is supplied from a reducing water supply unit 32 to the wafer storing water tank 18 through a reducing water supply pipe 31 on which a reducing water supply valve 30 is mounted. By controlling this valve 30, it is possible to adjust in level the reducing water 38 having been received in the wafer storing water tank 18. The reducing water 38 having been used in operation is discharged out of the wafer storing water tank 18 through a drain pipe 36 by controlling a drain valve 35 mounted on the drain pipe 36. The thus discharged reducing water 38 is then discarded after subjected to an appropriate treatment performed in an ecologically satisfactory manner.

The reducing water 38 may be prepared according to each of the following two independent processes, i.e., a bubbling process and an electrolytic cathode process: (Re: The bubbling process shown in FIG. 7):

In the bubbling process, as shown in FIG. 7, the reducing water supply unit 32 is initially filled with the pure water 39 which is supplied through a pure water supply pipe 37. On the other hand, a filter element 33 is installed inside the reducing water supply unit 32 so as to be immersed in the pure water 39 having been received in the reducing water supply unit 32. Supplied to the interior of the filter element 33 thus installed is hydrogen gas. This hydrogen gas is supplied from a hydrogen gas supply pipe 34, and issued from an outer surface of the filter element 33. In operation, this filter element 33 serves as a bubbler means for bubbling the thus supplied hydrogen gas through the pure water 39 received in the reducing water supply unit 32, so that the hydrogen gas thus issued from the filter element 33 forms a plurality of bubbles, and is dissolved into the pure water 39 to convert it into the reducing water 38 in the reducing water supply unit 32. (Re: The electrolytic cathode process not shown in the drawings):

In the electrolytic cathode process, the reducing water supply unit 32 is initially filled with the pure water 39 supplied through the pure water supply pipe 37. After that, a positive electrode called "anode" and a negative electrode called "cathode" are mounted inside the reducing water supply unit 32 in a manner such that these electrodes are immersed in the pure water 39 of the reducing water supply unit 32. In the electrolytic cathode process, the pure water 39 is mixed with suitable substance in the reducing water supply unit 32 to form an electrically conductive solution in the reducing water supply unit 32. Consequently, in operation, when a suitable voltage is applied between the anode and the cathode, the thus prepared solution of the reducing water supply unit 32 is decomposed. As a result, hydrogen gas bubbles are produced on a surface of the cathode, and dissolved into the pure water 39 to convert the pure water 39 into the reducing water 38.

In the reducing water 38 used in the apparatus of the present embodiment shown in FIG. 7, a concentration of hydrogen is within a range of from 0.1 ppm to 10 ppm, preferably within a range of from 1 ppm to 5 ppm.

As is clear from FIG. 7, the reducing water 38 is supplied from the reducing water supply unit 32 to the wafer storing water tank 18 through the reducing water supply pipe 31 at a flow rate of from 1 liter to 10 liters/minute. Since exposure of the reducing water 38 to the atmosphere promotes the deterioration of the reducing water 38, it is desirable to constantly supply fresh reducing water 38 to the wafer storing water tank 18. Further, it is also desirable to hermetically seal the wafer storing water tank 18 in order to prevent the reducing water 38 of the wafer storing water tank 18 from being brought into contact with the atmosphere.

Figure 8:
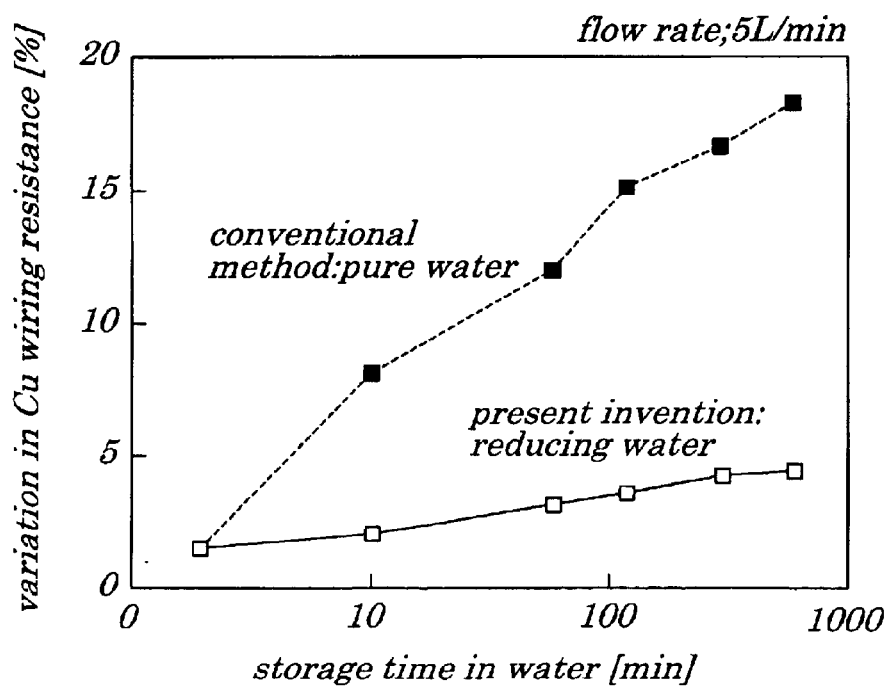
FIG. 8 is a graph showing effects of the method of the fourth embodiment comparison with conventional method on the electric resistance of the copper wiring of the polished semiconductor wafer after polishing.

In a graph shown in FIG. 8, the effects of the method of the present embodiment in comparison with the conventional method on the variation in electric resistance of the Cu or metallic wiring of each of the polished semiconductor wafers 20 after polishing are demonstrated. In this graph of FIG. 8, its horizontal axis represents the storage time, for which the polished semiconductor wafers 20 are immersed in the reducing water 38 of the wafer storing water tank 18 (shown in FIG. 7) according to the present embodiment, or immersed in the pure water 43 of the wafer storing water tank 18 (shown in FIG. 10) according to the conventional method.

More specifically, the graph of FIG. 8 shows the variation in electric resistance of the Cu or metallic wiring of each of the polished semiconductor wafers 20 on the vertical axis, wherein the variation in electric resistance of the Cu or metallic wiring of the polished semiconductor wafer 20 is represented as a function of the storage time of the polished semiconductor wafer 20 in the reducing water 38, or in the pure water 43. As is clear from the graph of FIG. 8, it is possible for the fourth embodiment to drastically reduce the variation in electric resistance of the Cu or metallic wiring of the polished semiconductor wafer 20 stored in the reducing water 38 in comparison with that of the corresponding Cu or metallic wiring of the polished semiconductor wafer 20 stored in the pure water 43 according to the conventional method. In other words, by storing the polished semiconductor wafer 20 in the above-specified reducing water 38 according to the present embodiment, it is possible for the present embodiment to drastically hinder the progress of corrosion occurring in the Cu or metallic wiring of the polished semiconductor wafer 20, which makes it possible to precisely produce various type of semiconductor devices as required by their designers.

In the above description, though the Cu or metallic damascene wiring has been described as the metallic wiring of the polished semiconductor wafer 20, it is also possible to apply the present invention to any other metallic parts of the polished semiconductor wafer, for example lower wiring layers, connecting plugs or like metallic parts of the polished semiconductor wafer, provided that such metallic parts are exposed after completion of the polishing operation of the semiconductor wafer.

Further, the metallic wiring of the semiconductor wafer may be made of any other metal or alloys in addition to copper or aluminum described above.

It is thus apparent that the present invention is not limited to the above embodiments but may be changed and modified without departing from the scope and spirit of the invention.

Finally, the present application claims the Convention Priority based on Japanese Patent Application No. Hei11-082840 filed on Mar. 26, 1999, which is herein incorporated by reference.

What is claimed is:

1. A method for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the method comprising the steps of:

adding an anticorrosion agent to pure water in a storage tank before placing the polished semiconductor wafer in the storage tank, wherein said anticorrosion agent added to said pure water prevents an oxidizing agent contained in an abrasive from chemically attacking said metallic wiring of said polished semiconductor wafer, wherein said abrasive is used in said chemical mechanical polishing process; and placing the polished semiconductor wafer in the storage tank containing the pure water and anticorrosion agent.

2. The method for storing the polished semiconductor wafer after completion of its chemical mechanical polishing process, according to claim 1, wherein: both said pure water and said anticorrosion agent added to said pure water are recycled through a water tank.

3. The method for storing the polished semiconductor wafer after completion of its chemical mechanical polishing process, according to claim 2, wherein: said metallic wiring of said polished semiconductor wafer is constructed of a damascene wiring or of a connecting plug.

4. The method for storing the polished semiconductor wafer after completion of its chemical mechanical polishing process, according to claim 3, wherein said metallic wiring of said polished semiconductor wafer is formed of metal selected from the group consisting of: copper; aluminum; alloys of copper; alloys of aluminum; and, copper-aluminum alloys.

5. The method for storing the polished semiconductor wafer after completion of its chemical mechanical polishing process, according to claim 4, wherein said anticorrosion agent added to said pure water is made of a compound selected from the group consisting of: benzotriazole; o-tolyltriazole; m-tolyltriazole; p-tolyltriazole; carboxybenzotriazole; 1-hydroxybenzotriazole; nitrobenzotriazole; dihydroxypropylbenzotriazole; and, a mixture of at least any two of the above-mentioned compounds.

6. The method for storing the polished semiconductor wafer after completion of its chemical mechanical polishing process, according to claim 4, wherein: said anticorrosion agent added to said pure water is made of benzotriazole.

7. The method for storing the polished semiconductor wafer after completion of its chemical mechanical polishing process, according to claim 6, wherein: addition of said anticorrosion agent made of benzotriazole to said pure water is made at a percentage of from 0.01% to 5%.

8. A method for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the method comprising the step of:

keeping said polished semiconductor wafer immersed in pure water having a predetermined temperature of 0° C. to 10° C., wherein said predetermined temperature decreases a rate of chemical reaction occurring in corrosion of said metallic wiring of said polished semiconductor wafer; and wherein said corrosion is caused by an oxidizing agent contained in an abrasive used in said chemical mechanical polishing process.

9. The method for storing the polished semiconductor wafer after completion of its chemical mechanical polishing process, according to claim 8, wherein: said metallic wiring of said polished semiconductor wafer is constructed of a damascene wiring or of a connecting plug.

10. The method for storing the polished semiconductor wafer after completion of its chemical mechanical polishing process, according to claim 9, wherein said metallic wiring of said polished semiconductor wafer is formed of metal selected from the group consisting of: copper; aluminum; alloys of copper; alloys of aluminum; and, copper-aluminum alloys.

11. A method for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the method comprising the step of:

spraying said polished semiconductor wafer with pure water having a predetermined temperature of 0° C. to 10° C., wherein said predetermined temperature decreases a rate of chemical reaction occurring in corrosion of said metallic wiring of said polished semiconductor wafer; and wherein said corrosion is caused by an oxidizing agent contained in an abrasive used in said chemical mechanical polishing process.

12. The method for storing the polished semiconductor wafer after completion of its chemical mechanical polishing process, according to claim 11, wherein: said metallic wiring of said polished semiconductor wafer is constructed of a damascene wiring or of a connecting plug.

13. The method for storing the polished semiconductor wafer after completion of its chemical mechanical polishing process, according to claim 12, wherein said metallic wiring of said polished semiconductor wafer is formed of metal selected from the group consisting of: copper; aluminum; alloys of copper; alloys of aluminum; and, copper-aluminum alloys.

14. A method for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the method comprising the step of:

supplying reducing water to a storage tank so that the storage tank contains only the reducing water before placing the polished semiconductor wafer in the storage tank; and immersing the polished semiconductor in the reducing water in the storage tank.

15. The method for storing the polished semiconductor wafer after completion of its chemical mechanical polishing process, according to claim 14, wherein: said reducing water is prepared by bubbling hydrogen gas through pure water, or retrieved from a cathode side of pure water during the electrolysis of said pure water.

16. An apparatus for storing a polished semiconductor wafer after completion of its chemical mechanical polishing process for a period of time between said chemical mechanical polishing process for forming a metallic wiring in the polished semiconductor wafer and a cleaning process of the thus polished semiconductor wafer, wherein the cleaning process follows the chemical mechanical polishing process, the apparatus comprising:

means for adding reducing water not containing an abrasive agent to a water tank already having said polished semiconductor wafer immersed in the reducing water, wherein said water tank is hermetically sealed in a manner such that said water tank has no communication with the atmosphere.

17. The apparatus for storing the polished semiconductor wafer after completion of its chemical mechanical polishing process, according to claim 16, wherein: said metallic wiring of said polished semiconductor wafer is constructed of a damascene wiring or of a connecting plug.

18. An apparatus for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the apparatus comprising:

a water tank for storing said polished semiconductor wafer therein;

a pure water supply means for supplying pure water to said water tank and an anticorrosion agent supply means for adding an anticorrosion agent to said pure water to prevent an oxidizing agent contained in an abrasive from chemically attacking said metallic wiring of said polished semiconductor wafer, wherein said abrasive is used in said chemical mechanical polishing process;

a recycling means for recycling said pure water together with said anticorrosion agent through both a filter and said water tank; and a discharging means for discharging out of said water tank both said pure water and said anticorrosion agent both received in said water tank.

19. The apparatus for storing the polished semiconductor wafer after completion of its chemical mechanical polishing process, according to claim 18, wherein: said recycling means is provided with a pump and said filter both disposed outside said water tank.

20. The apparatus for storing the polished semiconductor wafer after completion of its chemical mechanical polishing process, according to claim 18, wherein: said metallic wiring of said polished semiconductor wafer is constructed of a damascene wiring or of a connecting plug.

21. An apparatus for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the apparatus comprising:

a water tank for storing said polished semiconductor wafer therein;

a pure water supply means for supplying pure water to said water tank, wherein said pure water has a predetermined temperature of 0° C. to 10° C. that decreases a rate of chemical reaction occurring in corrosion of said metallic wiring of said polished semiconductor wafer, wherein said corrosion is caused by an oxidizing agent contained in an abrasive used in said chemical mechanical polishing process; and a discharging means for discharging out of said water tank said pure water received in said water tank.

22. The apparatus for storing the polished semiconductor wafer after completion of its chemical mechanical polishing process, according to claim 21, wherein: said metallic wiring of said polished semiconductor wafer is constructed of a damascene wiring or of a connecting plug.

23. An apparatus for storing a polished semiconductor wafer after completion of its chemical mechanical polishing process for a period of time intervened between: said chemical mechanical polishing process for forming a metallic wiring in the polished semiconductor wafer; and, a cleaning process of the thus polished semiconductor wafer, wherein the cleaning process follows the chemical mechanical polishing process, the apparatus comprising:

a spray means for spraying said polished semiconductor wafer with pure water having a predetermined temperature of 0° C. to 10° C. that decreases a rate of chemical reaction occurring in corrosion of said metallic wiring of said polished semiconductor wafer, wherein said corrosion is caused by an oxidizing agent contained in an abrasive used in said chemical mechanical polishing process.

24. The apparatus for storing the polished semiconductor wafer after completion of its chemical mechanical polishing process, according to claim 23, wherein: said metallic wiring of said polished semiconductor wafer is constructed of a damascene wiring or of a connecting plug.

\* \* \* \* \*